United States Patent [19]
Pelzl et al.

[11] Patent Number: 4,652,066
[45] Date of Patent: Mar. 24, 1987

[54] INSERTIBLE ELECTRIC ASSEMBLY

[75] Inventors: Leo Pelzl, Holzkirchen; Juergen Seibold, Baierbrunn; Karl Zell, Niederpoecking, all of Fed. Rep. of Germany

[73] Assignee: Siemens Aktiengesellschaft, Berlin and Munich, Fed. Rep. of Germany

[21] Appl. No.: 780,338

[22] Filed: Sep. 26, 1985

[30] Foreign Application Priority Data

Sep. 26, 1984 [DE] Fed. Rep. of Germany ....... 3435360

[51] Int. Cl.$^4$ .............................................. H01R 9/09
[52] U.S. Cl. ................................................ 339/17 LC
[58] Field of Search .................... 339/17 LC, 176 MP

[56] References Cited
U.S. PATENT DOCUMENTS
4,425,015 1/1984 Rizzo ............................. 339/17 LC Primary Examiner—Neil Abrams
Attorney, Agent, or Firm—Hill, Van Santen, Steadman & Simpson

[57] ABSTRACT

An electric assembly is provided with a multi-row plug strip which is connected to a carrier plate arranged in the extension zone of a central row of contacts. The connector elements of the outer row of contact elements are bent into the region of the next row, around the end of the circuit board, and are inserted into bores of the circuit board from the same side as the connector elements of the other rows. The two outer rows of receiving chambers which are adjacent to the circuit board are equipped with contact elements in alternation and offset relative to one another. By means of the invention the circuit board is displaced inwards away from the spacing boundary. The plug forces are thus transferred to the circuit board in a less one-sided fashion.

6 Claims, 2 Drawing Figures

INSERTIBLE ELECTRIC ASSEMBLY

BACKGROUND OF THE INVENTION

1. Field of the Invention

The invention relates to an insertible electric assembly with a carrier plate and with a plug strip which is applied to the carrier plate and which is provided with several rows of receiving chambers arranged in the form of a grid, for contact elements whose connector elements, bent at right angles are inserted from one side into bores of the carrier plate.

2. Description of the Prior Art

It is known to arrange the carrier plates in alignment with the longitudinal side surface of the plug strip. Here it can occur that the circuit board may extend into the region of the adjacent outer row of chambers. However, sufficient free space always remains in order to guide the connector elements in a straight line along the circuit board to the bores into which they are inserted. In such an arrangement the danger exists that those ends of the connector elements which project from the circuit board, and those ends of the components with which the circuit board is equipped which project through the circuit board may project into the region of the adjacent assembly. In particular when the assembly is inserted between two already inserted adjacent assemblies, mutual contact can occur.

SUMMARY OF THE INVENTION

The aim of the invention is to improve upon the construction of the assembly and to avoid the danger of damage.

This aim is fulfilled by having the carrier plate arranged in the extension zone of an inner row of receiving chambers, and having the connector elements of the outer row, which is arranged on that side of the carrier plate which faces towards the free ends of the connector elements are bent in U-formation around the end of the carrier plate, and having the receiving chambers of this row and at least the adjoining row kept free of contact elements in alternation and offset relative to one another. The circuit board is thus moved inwards away from the edge of the plug strip. Its end side covers a part of the longest chamber row. Those ends of the connector elements which project through the circuit board are at a sufficient distance from the spacing boundary which is governed by the longitudinal side of the plug strip. When the assembly is placed on to the plug-in device of the container rear wall, the distribution of force is less one-sided as the circuit board, over which the plug-in forces are conducted, is displaced towards the center of the plug strip.

For reasons of production technology it is expedient that the ends of the connector elements should be inserted into the associated bores of the circuit board all from one side. This means that the connector elements of the outer row must at least be bent into the region of the next row of connector elements. Since the receiving chambers are occupied in alternation and offset relative to one another, mutual contact is avoided. The contact elements of these two rows are now spaced at a greater distance from one another so that the danger of mutual electric influence is avoided. For this reason the conductors which are particularly electrically endangered are assigned to these two rows.

BRIEF DESCRIPTION OF THE DRAWINGS

In the following the invention will be explained in detail in the form of an exemplary embodiment which is illustrated in the drawing in which.

DESCRIPTION OF THE PREFERRED EMBODIMENTS

Figure 2:
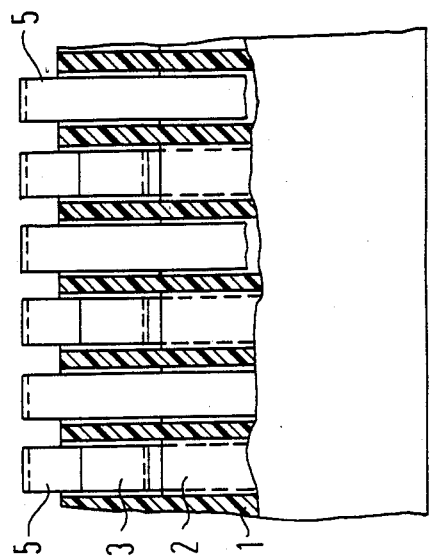
FIG. 2 is a partial section through the plug strip along the line II—II in FIG. 1.
Figure 1:
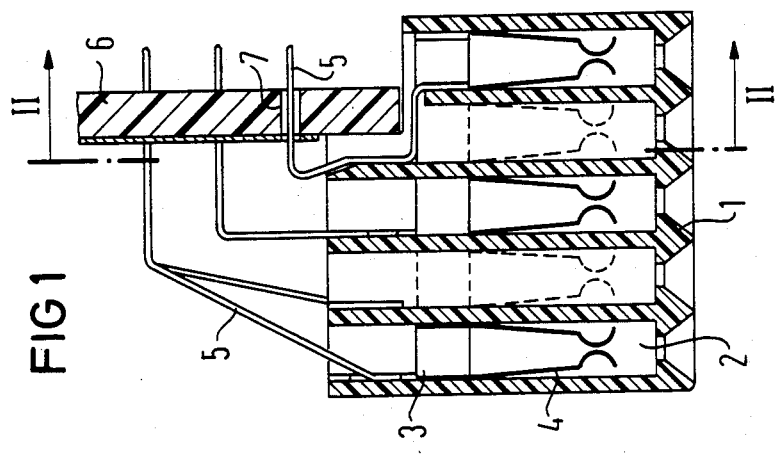
FIG. 1 is a partial section through an insertible electric assembly with a plug strip.

In accordance with FIGS. 1 and 2, a plug strip of an insertible electric assembly consists of a housing 1 with a plurality of rows of receiving chambers 2 for contact elements 3. These are integrally composed of contact springs 4 and connector elements 5. The free ends of the connector elements are bent at right angles to the receiving chambers 2 and are inserted from one side into bores 7 of a circuit board 6. The circuit board is arranged in an extension zone above a second-from-outer row 8 of receiving chambers. The connector elements 5 of an adjacent outer row 9 are bent in U-formation (as at 10) to the opposite side of the carrier plate 6 around an end 11 thereof, and thus extend above and cover the receiving chambers 2 of the next row 8. The receiving chambers 2 of these two rows 8, 9 are alternately equipped with contact elements, offset relative to one another, so that the connector elements 5 cannot contact one another. Further, these two rows of contact elements are preferably connected to conductors which are subject to a particular electric stress which the alternating spacing will help to alleviate.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. An insertable electrical assembly comprising:
   a carrier plate having a plurality of bores through a front and rear side thereof;
   a plug strip to be connected to said carrier plate;
     said plug strip being provided with a plurality of rows and columns of individual receiving chambers, arranged in the form of a grid with a rearmost outer row and a plurality of inner rows;
   contact elements to be received in said receiving chambers;
     said contact elements having connector elements bent at substantially right angles to be inserted into said carrier plate bores through the front side of said carrier plate;
     said carrier plate lying in a plane comprising an extension of one of said inner rows of receiving chambers;
     said contact elements which are received in said chambers of said outer row being bent in U-formation around an end of said carrier plate which is positioned adjacent to said plug strip; and
     said contact elements received in said outer row being placed in alternating columns from contact elements received in at least the adjacent inner row;

whereby said contact elements in said outer row and said adjacent inner row are staggered and are kept clear of contact with one another.

2. An assembly according to claim 1, wherein said carrier plate is arranged in an extension zone of a row of receiving chambers immediately adjacent said outer row.

3. An assembly according to claim 2, wherein contact elements connected to conductors subject to a particular electronic stress being assigned to said outer or immediately adjacent rows.

4. An electric assembly comprising:
- a carrier plate having a plurality of bores therethrough;
- a plug strip having several rows and columns of receiving chambers, arranged in the form of a grid with an outer row and a plurality of inner rows;
- a plurality of contact elements having a connector element at one end and a contact spring at an opposite end;
    - said carrier plate being positioned in an extension zone of an inner row of said receiving chambers;
    - said contact springs being receivable in said receiving chambers and said connector elements being bent at right angles to said receiving chambers and inserted into said bores in said carrier plate through a first side of said plate;
    - said contact elements having their contact springs inserted into an outer row of receiving chambers positioned on a second side of said plate being bent in U-formation around an end of said carrier plate;
    - said columns of receiving chambers of said outer row and at least the adjoining inner row being kept free of contact elements in alternation;

whereby said contact elements will be offset relative to one another.

5. An assembly according to claim 4, wherein said carrier plate is arranged in an extension zone of a row of receiving chambers immediately adjacent said outer row.

6. An assembly according to claim 5, wherein contact elements connected to conductors subject to a particular electronic stress being assigned to said outer or immediately adjacent rows.

* * * * *